(12) United States Patent
Lee et al.

(10) Patent No.: US 7,889,479 B2
(45) Date of Patent: Feb. 15, 2011

(54) INTEGRATED MULTILAYER CHIP CAPACITOR MODULE AND INTEGRATED CIRCUIT APPARATUS HAVING THE SAME

(75) Inventors: Byoung Hwa Lee, Gyunggi-do (KR); Sung Kwon Wi, Seoul (KR); Sang Soo Park, Gyunggi-do (KR); Min Cheol Park, Gyunggi-do (KR); Dong Seok Park, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 439 days.

(21) Appl. No.: 12/007,737

(22) Filed: Jan. 15, 2008

(65) Prior Publication Data

US 2008/0204971 A1    Aug. 28, 2008

(30) Foreign Application Priority Data

Feb. 26, 2007   (KR) .................. 10-2007-0019232

(51) Int. Cl.
*H01G 4/228* (2006.01)

(52) U.S. Cl. .......... 361/306.2; 361/306.1; 361/306.3; 361/301.4; 361/303; 361/305

(58) Field of Classification Search .......... 361/306.2, 361/311–313, 321.1, 321.2, 306.1, 301.4, 361/306.3, 303–305
See application file for complete search history.

(56) References Cited

U.S. PATENT DOCUMENTS

| | | | |
|---|---|---|---|
| 5,493,769 A | | 2/1996 | Sakai et al. |
| 6,370,010 B1 * | | 4/2002 | Kuroda et al. ............ 361/306.1 |
| 6,407,907 B1 * | | 6/2002 | Ahiko et al. ............. 361/306.3 |
| 6,459,561 B1 * | | 10/2002 | Galvagni et al. ......... 361/306.3 |
| 6,542,352 B1 * | | 4/2003 | Devoe et al. ............. 361/321.2 |
| 6,907,658 B2 * | | 6/2005 | Li .............................. 29/832 |
| 7,054,136 B2 * | | 5/2006 | Ritter et al. ................. 361/309 |
| 7,151,661 B2 * | | 12/2006 | Kimura et al. ........... 361/306.3 |
| 7,499,258 B2 * | | 3/2009 | Shim et al. .................. 361/307 |

FOREIGN PATENT DOCUMENTS

| | | |
|---|---|---|
| JP | 07-050488 A | 2/1995 |
| JP | 11-329895 | 11/1999 |
| JP | 2002-083515 A | 3/2002 |

OTHER PUBLICATIONS

Korean Office Action issued in Korean Patent Application No. KR 10-2007-0019232, mailed Dec. 15, 2008.

* cited by examiner

*Primary Examiner*—Nguyen T Ha
(74) *Attorney, Agent, or Firm*—McDermott Will & Emery LLP

(57) ABSTRACT

An integrated multilayer chip capacitor module including: plurality of multilayer chip capacitors arranged close to one another and co-planar with one another; and a capacitor support accommodating the multilayer chip capacitors, wherein each of the multilayer chip capacitors includes a rectangular parallelepiped capacitor body and a plurality of first and second external electrodes formed on at least two sides of the capacitor body, and the external electrodes on adjacent sides of adjacent ones of the multilayer chip capacitor in the capacitor support are electrically connected to each other by a conductive adhesive material.

17 Claims, 13 Drawing Sheets

INTEGRATED MULTILAYER CHIP CAPACITOR MODULE AND INTEGRATED CIRCUIT APPARATUS HAVING THE SAME

CROSS-REFERENCE TO RELATED APPLICATIONS

This application claims the priority of Korean Patent Application No. 2007-19232 filed on Feb. 26, 2007, in the Korean Intellectual Property Office, the disclosure of which is incorporated herein by reference.

BACKGROUND OF THE INVENTION

1. Field of the Invention

The present invention relates to an integrated multilayer chip capacitor module and an integrated circuit apparatus having the capacitor module, and more particularly, an integrated multilayer chip capacitor module which has capacitors mounted at a higher density to reduce power network impedance in high and low frequency regions, and a micro-processor unit (MPU) integrated circuit apparatus having the same.

2. Description of the Related Art

In general, a multilayer chip capacitor has internal electrodes of different polarities deposited alternately to interpose each of dielectric layers. This multilayer chip capacitor advantageously ensures a smaller size, a higher capacity and easy mountability, thus widely used as a capacitive component of various electronic devices. Especially, the multilayer chip capacitor is considerably utilized as a decoupling capacitor for stabilizing a high frequency power circuit for use in e.g., a micro-processor unit (MPU). To be employed as a decoupling capacitor of the MPU, the capacitor should have a low ESL. This demand for a lower ESL has been rising due to a higher speed of the MPU and a resultant higher current and lower voltage trend.

To be employed in an MPU package, decoupling capacitors need to be connected in parallel to lower power network impedance. For much lower impedance, a greater number of capacitors are connected in parallel. However, a greater number of capacitors connected in parallel increase a total mounting area, thereby resulting in less decline in overall impedance in a limited mounting area.

To overcome problems associated with a limited mounting area, the capacitors may be reduced in size so that a greater number of capacitors can be mounted in the MPU package, with an overall mounting area maintained. The smaller-sized capacitors may decrease total impedance at a high frequency, but increase impendence at a low frequency due to decrease in total capacitance. This is because impedance at a high frequency is mainly determined by $\omega L$, where $\omega$ denotes an angular frequency, and L denotes an inductance, whereas impedance at a low frequency is largely determined by $1/\omega C$, where C is capacitance.

Therefore to reduce power network impedance at a high frequency and a low frequency, it is necessary that individual capacitors be reduced in ESL and the decoupling capacitors be mounted at a higher density. That is, the multilayer chip capacitors should be arranged to ensure as large capacitance as possible in a limited overall mounting area, and respective multilayer chip capacitors should be low in ESL.

An integrated capacitor assembly (module) having a plurality of multilayer chip capacitors arrayed thereon to be connected with one another has been proposed. FIG. 1 is a perspective view illustrating a conventional integrated multilayer capacitor module. Referring to FIG. 1, the integrated multilayer capacitor module 10 includes a plurality of two-terminal multilayer chip capacitors 11 and a capacitor support 15 accommodating the capacitors. Each of the capacitors 11 has two external electrodes 12 formed at both sides thereof, respectively. The capacitors 11 are separated from one another by side walls 15a and disposed in the capacitor support. A module or assembly of these integrated capacitors may be mounted on a circuit board, e.g., micro-processor unit (MPU) package.

In the multilayer chip capacitor module of FIG. 1, 'two terminal' capacitors can be integrated into a single module structure, but 'multi-terminal' multi-layer capacitors cannot be mounted at a higher density and with lower ESL. To further reduce impedance at a high and low frequency, multi-terminal low-ESL multilayer chip capacitors for use in the MPU package should be mounted at a higher density.

SUMMARY OF THE INVENTION

An aspect of the present invention provides an integrated chip capacitor module which has lower impedance at a high and low frequency to achieve better decoupling effects in a broader frequency range, and an integrated circuit apparatus having the same.

According to an aspect of the present invention, there is provided an integrated multilayer chip capacitor module including: a plurality of multilayer chip capacitors arranged close to one another and co-planar with one another; and a capacitor support accommodating the multilayer chip capacitors, wherein each of the multilayer chip capacitors includes a rectangular parallelepiped capacitor body and a plurality of first and second external electrodes formed on at least two sides of the capacitor body, and the external electrodes on adjacent sides of adjacent ones of the multilayer chip capacitor in the capacitor support are electrically connected to each other by a conductive adhesive material.

The capacitor body includes a plurality of first and second internal electrodes arranged alternately while interposing a dielectric layer therebetween, each of the internal electrodes having at least one lead extended to a side of the capacitor body, and the first and second external electrodes are connected to the first and second internal electrodes through the lead, respectively.

The first and second external electrodes may be partially extended to a top of the capacitor body. The capacitor support may be open at a top thereof so as to expose top surfaces of the multilayer chip capacitors.

The first and second external electrodes may be partially extended to a top and bottom of the capacitor body. The capacitor support may be open at a top and bottom thereof so as to expose top and bottom surfaces of the multilayer chip capacitors. Extension portions of the external electrodes extended to the top and bottom of the capacitor body may have respective solder balls disposed thereon to be connected to a corresponding one of the external electrodes.

The first and second external electrodes in the multilayer chip capacitor may be arranged alternately along an edge of the capacitor body.

The multilayer chip capacitor may have four external electrodes formed on four sides of the capacitor body, respectively, wherein the external electrodes are arranged to have different polarities alternately, along an edge of the capacitor body.

The multilayer chip capacitor may have eight external electrodes formed on four sides of the capacitor body, each of the sides having two of the external electrodes, wherein the external electrodes are arranged to have different polarities alternately, along an edge of the capacitor body.

The multilayer chip capacitor may have at least two external electrodes on two opposing sides of the capacitor body, respectively, wherein the external electrodes are arranged to have different polarities alternately on each of the sides.

The multilayer chip capacitors may be arranged in a matrix of n×m in the capacitor support, wherein n and m are integers of at least 1 and n+m≧3.

The conductive adhesive material may be selected from one of silver, nickel, gold, copper and a mixture of at least two thereof. The conductive adhesive material may be a heat-resistant adhesive capable of resisting a temperature of 250° C.

According to another aspect of the present invention, there is provided an integrated circuit apparatus including: the integrated multi-layer chip capacitor module described above; and a circuit board having the integrated multi-layer chip capacitor module mounted thereon. The integrated circuit may be surface-mounted on a mother board.

A multi-processor unit chip may be surface-mounted on the circuit board and the multilayer chip capacitor module may be mounted in a cavity formed in the circuit board.

The integrated circuit apparatus may further include a socket disposed on one surface of the circuit board to accommodate the integrated multilayer chip capacitor, wherein the circuit board has the multi-processor unit chip surface-mounted on another surface thereof.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
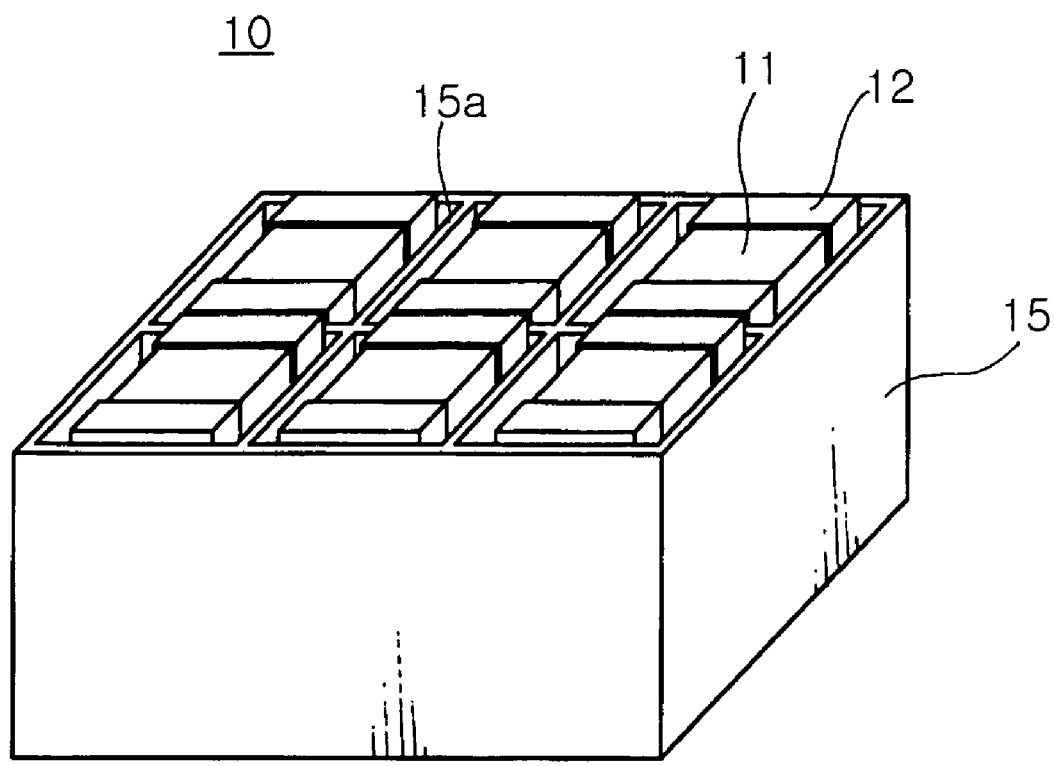
FIG. 1 is a perspective view illustrating an integrated multilayer chip capacitor module according to the prior art.
Figure 2A:
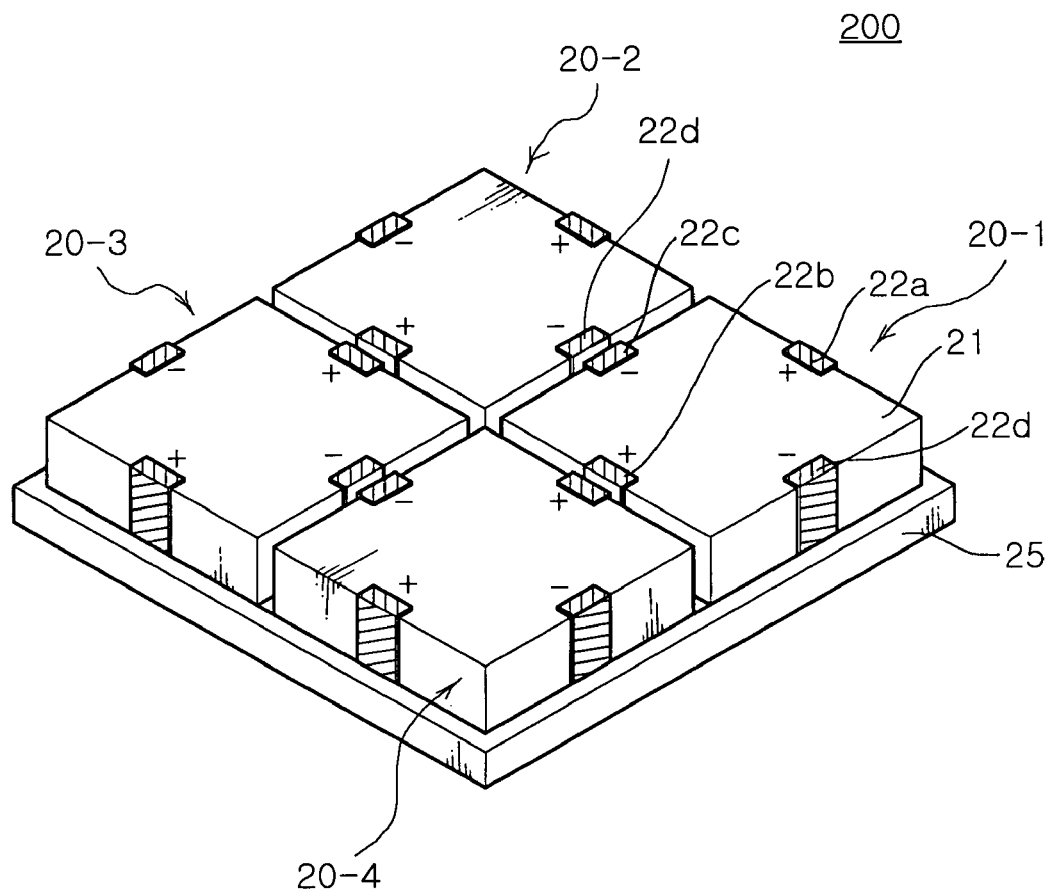
FIG. 2A is a perspective view illustrating an integrated multi-layer chip capacitor module according to an exemplary embodiment of the invention.
Figure 2B:
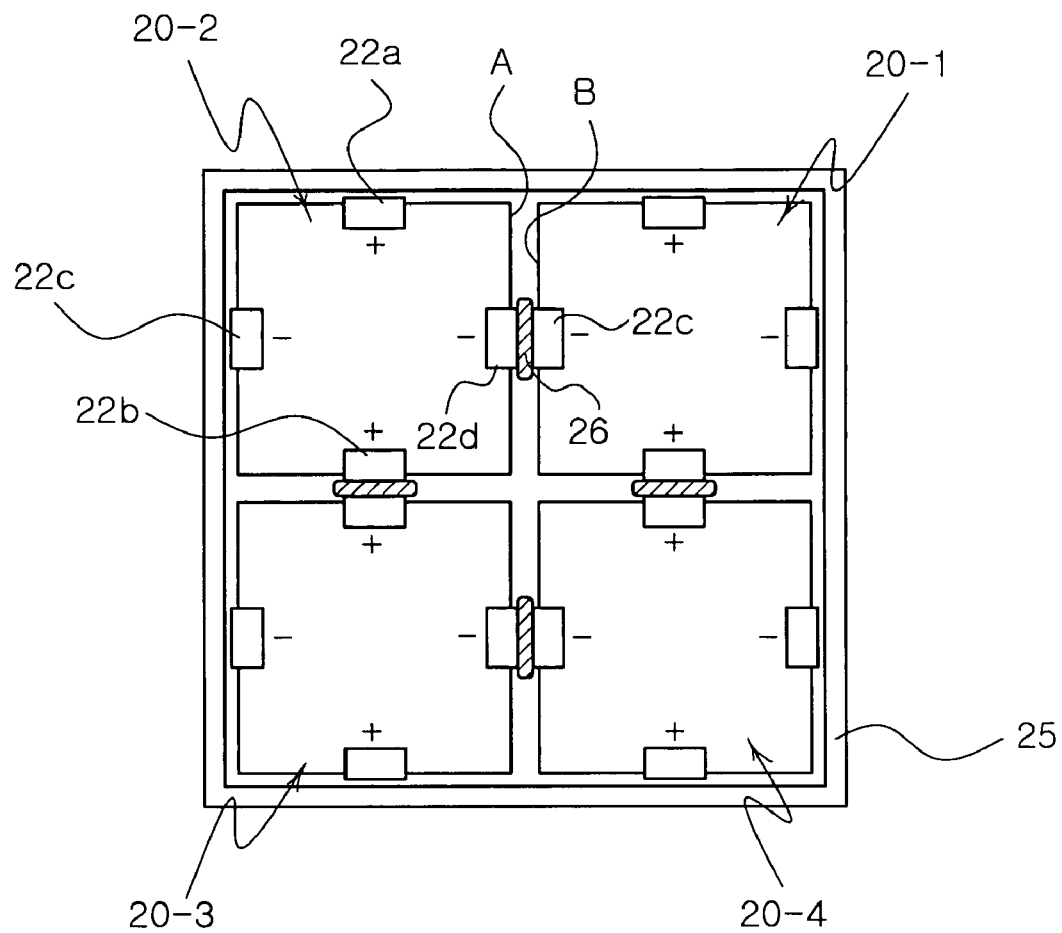
FIG. 2B is a plan view of the integrated multi-layer chip capacitor module shown in FIG. 2B.

FIGS. 2A and 2B are a perspective view and a plan view illustrating an integrated multilayer chip capacitor module, respectively according to an exemplary embodiment of the invention.

Referring to FIGS. 2A and 2B, the integrated multilayer chip capacitor module 200 includes a plurality of multilayer chip capacitors 20-1, 20-2, 20-3, and 20-4, and a capacitor support 25 accommodating these capacitors 20-1 to 20-4. The capacitors 20-1 to 20-4 are arranged close to one another and co-planar with one another. Especially, according to the present embodiment, the four capacitors 20-1 to 20-4 are arranged in a 2×2 matrix in the capacitor support 25. However, the present invention is not limited thereto and the capacitors may be arranged close to one another and co-planar with one another in various configurations (see FIGS. 4 and 10).

Each of the capacitors 20-1 to 20-4 includes a rectangular parallelepiped capacitor body 21, first external electrodes 22a and 22b and second external electrodes 22c and 22d formed on four sides of the capacitor body 21. Here, the external electrodes may be formed on at least two sides of the body. A plurality of first and second internal electrodes are arranged to interpose a dielectric layer therebetween (see FIG. 3). The first external electrodes 22a and 22b, and the second external electrodes 22c and 22d have different polarities from each other. That is, the first external electrodes 22a and 22b have plus polarity and the second external electrodes 22c and 22d have minus polarity.

In the capacitor 20-1 to 20-4, the first external electrodes 22a and 22b and second external electrodes 22c and 22d of different polarities are arranged alternately along an edge of the capacitor body 21. Notably, the four external electrodes are formed on the four sides of the capacitor body 21, respectively. Therefore, the capacitors 20-1 to 20-4 define a four-terminal capacitor. However, the present invention is not limited thereto and may be applied to a multi-terminal capacitor having different numbers of terminals such as six terminals, eight terminals, ten terminals, and an external electrode configuration (see FIGS. 9 and 10). Each of the external electrodes 22a to 22d is partially extended onto a top of the capacitor body 21. As described later, an extension portion of the external electrode extended to the top of the capacitor body 21 may serve to connect an external circuit with the integrated capacitor module 200 mounted on a circuit board or a wiring board.

The capacitor support 25 provides a mechanical structure for accommodating the plurality of capacitors 20-1 to 20-4. In the present embodiment, the capacitor support 25 includes a base portion for mounting the capacitors thereon and side walls. The capacitor support 25 may be formed of a plastic or ceramic material, particularly an insulating material with high heat resistance, but not limited thereto. As shown in FIG. 2A, the capacitor support 25 is open at a top thereof so as to expose the extension portions of the external electrodes 22a to 22d extended onto the top of the capacitor body 21.

The external electrodes, e.g., 22c of the capacitor 20-1 and 22d of the capacitor 20-2 on adjacent sides of adjacent ones e.g., 20-1 and 20-2 of the capacitors are electrically connected to each other by a conductive adhesive material 26. The external electrodes of same polarity are connected to each other by this conductive adhesive material 26, thereby allowing the capacitors 20-1 to 20-4 to be connected in parallel with one another.

The conductive adhesive material 26 may be formed of a highly conductive material such as silver, nickel, gold, copper and a mixture of at least two thereof, but not limited thereto. For example, a metal powder such as silver and nickel, and carbon may be mixed and dispersed uniformly in a synthetic resin such as an epoxy resin, an acrylic resin, and a modified urethane resin or a synthetic rubber, which exhibit a strong adhesion force, to produce a conductive adhesive. The conductive adhesive can be utilized as the conductive adhesive material 26 for connecting the external electrodes with one another. When the integrated capacitor module 200 is mounted on the wiring board such as a printed circuit board (PCB) via soldering (see FIG. 5), a heat resistant adhesive material capable of withstanding a high soldering temperature of at least 250° C. may be employed. Also, the integrated capacitor module 200 may be directly mounted on the wiring board such as the PCB using e.g., the conductive adhesive material 260. The conductive adhesive material 26 may be partially extended to outer peripheral portions of the external electrodes in contact therewith. Unless the external electrodes of different polarities are shorted to each other, the conductive adhesive material 26 may be partially extended to the outer peripheral portions of the external electrodes.

Figure 3A:
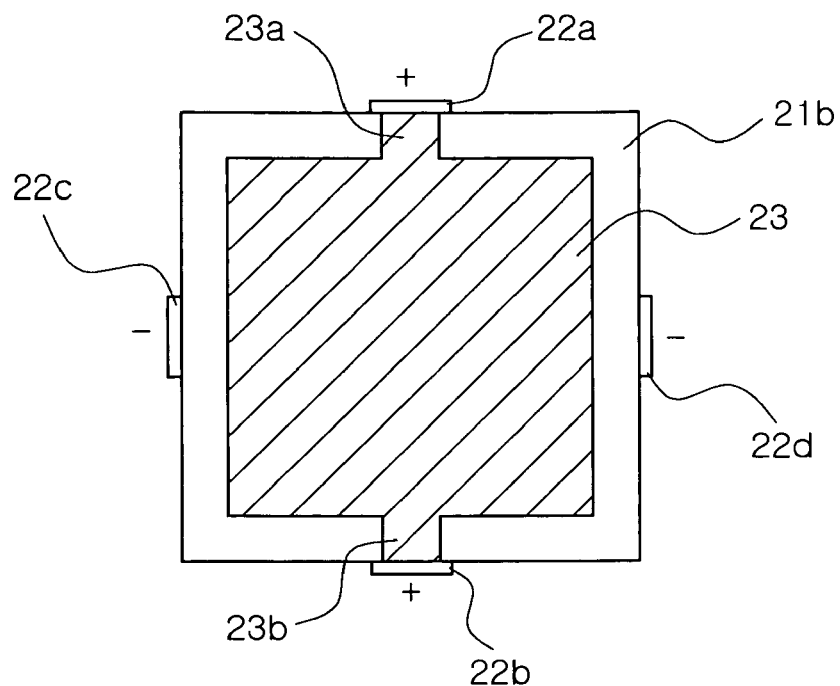
FIG. 3 is a cross-sectional view illustrating an internal electrode structure of individual capacitors employed in the multilayer chip capacitor module of FIG. 2A.
Figure 3B:
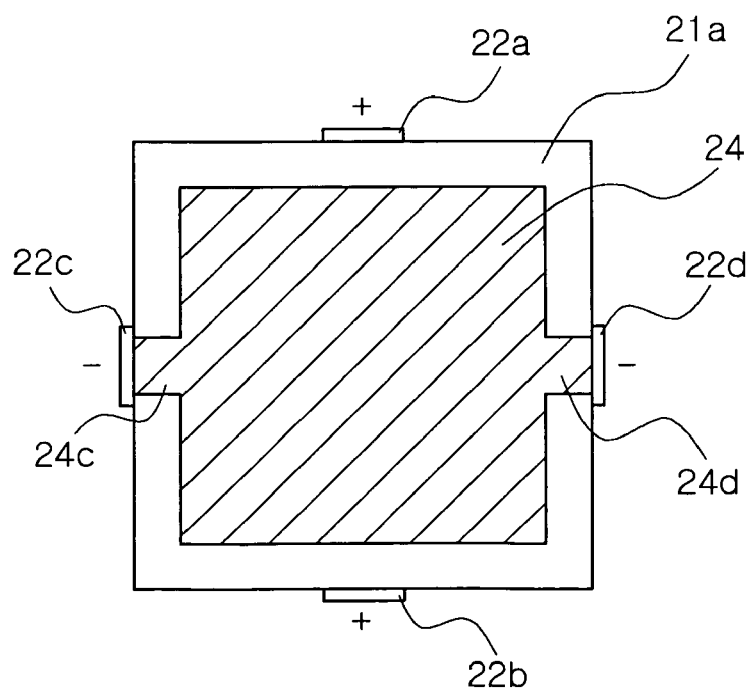

FIG. 3 is a cross-sectional view illustrating an internal electrode structure of an individual capacitor employed in the integrated capacitor module 200 of FIG. 2A. FIG. 3A is a cross-section, in which a first internal electrode is extended and FIG. 3B is a cross-section, in which a second internal electrode is extended.

Referring to FIG. 3A, a first internal electrode 23 of one polarity, e.g., plus polarity is formed on a dielectric layer 21a. The first internal electrode 23 has a square-shaped main electrode portion and leads 23a and 23b extended from the main electrode portion toward sides of the dielectric layer 21a, i.e., sides of the capacitor body 21. The first internal electrode 23 is electrically connected to first external electrodes 22a and 22b via the leads 23a and 23b. Referring to FIG. 3B, a second internal electrode 24 of different polarity, e.g., minus polarity is formed on the dielectric layer 21b. The second internal electrode 24 has a square-shaped main electrode portion and leads 24c and 24d extended from the main electrode portion toward sides of the dielectric layer 21b, i.e., sides of the capacitor body 21. The second internal electrode 24 is electrically connected to second external electrodes 22c and 22d via the leads 24c and 24d.

The dielectric layers 21b and 21a having the first and second internal electrodes 23 and 24 formed thereon, respectively, are stacked alternately to constitute the capacitor body 21 as shown in FIG. 2A. Accordingly, in the capacitor body 21, the first internal electrode 23 and the second internal electrode 24 are arranged to oppose each other while interposing a corresponding one of the dielectric layers 21a or 21b. The internal electrode structure shown in FIG. 3 is only exemplary, and may be varied to form the capacitors 20-1 to 20-4 shown in FIG. 2A. For example, each of the internal electrodes may have only one lead. Here, the first to fourth internal electrodes connected to the external electrodes 22a, 22d, 22b, and 22c, respectively, by the corresponding one lead may be arranged sequentially to constitute a block. The block may be repeatedly stacked (not shown).

With this structure above, a plurality of multi-terminal multilayer chip capacitors are stacked to enable the decoupling capacitors to be mounted in a minimum space and at the greatest density. This accordingly reduces total inductance as much as possible in a limited mounting area, and also increases total capacitance. When the integrated capacitor module is used as a decoupling capacitor, decrease in total inductance and increase in capacitance density result in decrease in total impedance of an MPU power circuit in a high frequency and a low frequency region.

Figure 4:
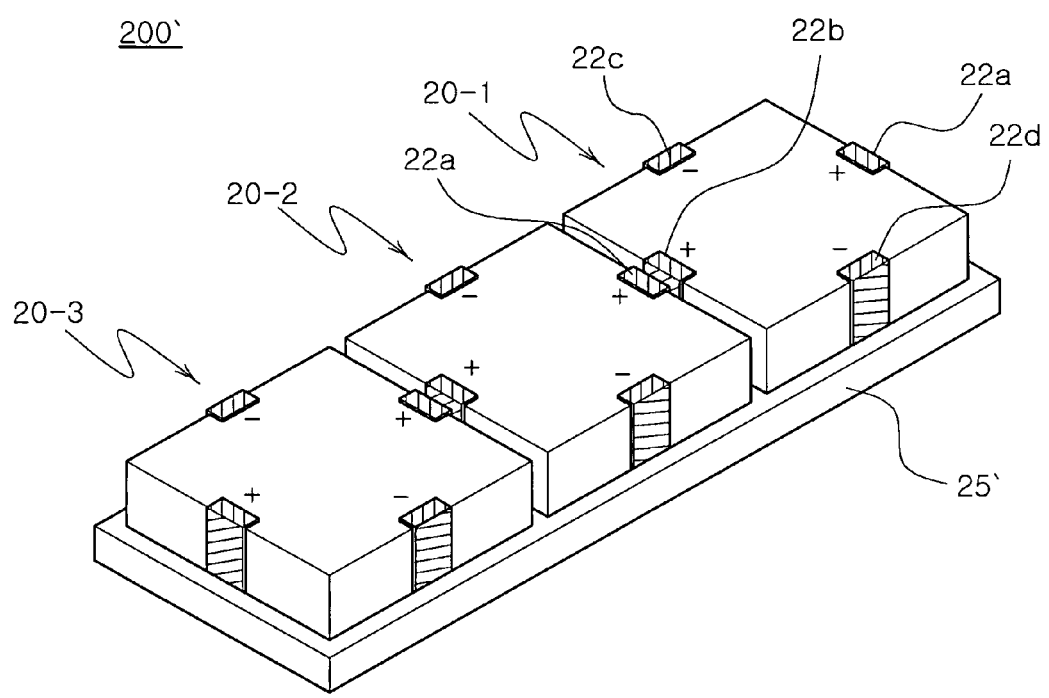
FIG. 4 is a perspective view illustrating an integrated multilayer chip capacitor according to an exemplary embodiment of the invention.

FIG. 4 is a perspective view illustrating an integrated multilayer chip capacitor according to an exemplary embodiment of the invention. In the integrated capacitor module 200' of FIG. 4, three capacitors 20-1, 20-2, and 20-3 are mounted on a capacitor support 25' and arranged close to one another in a 1×3 or 3×1 matrix. Other components such as external electrodes and a conductive adhesive material are identical to the previous embodiment and thus will not be explained further.

As described above, the plurality of capacitors may be arranged co-planar with one another in various configurations. More generally, the capacitors may be arranged in an n×m matrix, where n and m are integers of at least 1, and n+m≧3. In the present embodiment, multi-terminal capacitors are mounted at a higher density and thus lowered in impedance in a high frequency region and a low frequency region when utilized as a decoupling capacitor.

Figure 5:
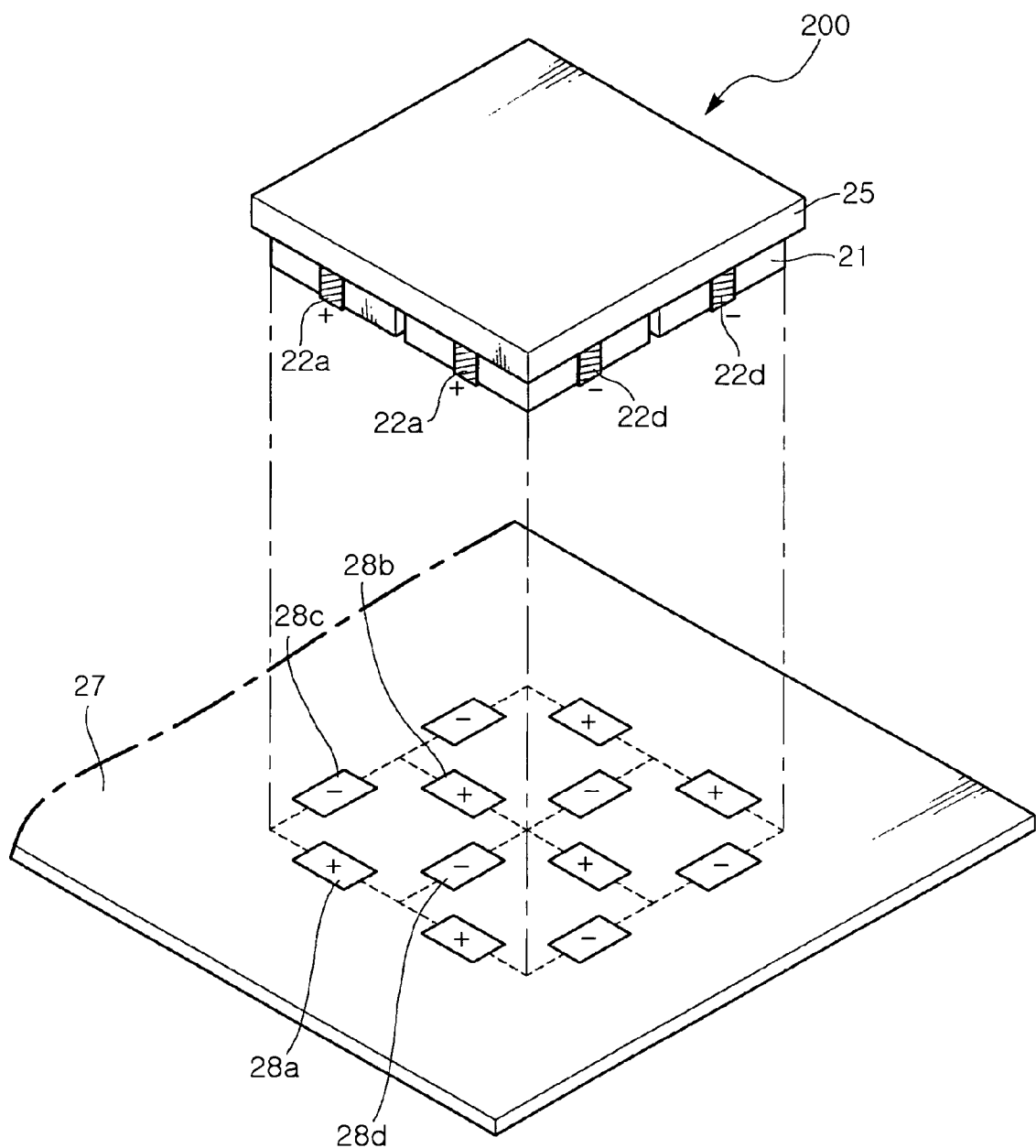
FIG. 5 is a view illustrating the integrated multilayer chip capacitor module of FIG. 2A mounted on a board.

FIG. 5 is a view illustrating a mounting position of the integrated multilayer chip capacitor module of FIG. 2A on a wiring board such as PCB or circuit board. Referring to FIG. 5, a plurality of conductive pads 28a, 28b, 28c, and 28d may be arranged on the circuit board 27 to be matched in position to external electrodes 22a to 22d of the capacitor module 200. Then, the capacitor module 200 is properly aligned with the circuit board 27 having the conductive pads 28a, 28b, 28c, and 28d matched in position to the external electrodes 22a to 22d, and then electrically connected to the circuit board 27 of the capacitor module 200 by soldering. The external electrodes 22a to 22d may be connected to the conductive pads 28a to 28d by a proper solder material or a conductive adhesive. Alternatively, the external electrodes and the conductive pads may be connected together by a ball grid array (BGA). Here, the wiring board 27 may be an MPU package where an MPU chip is mounted.

Figure 6A:
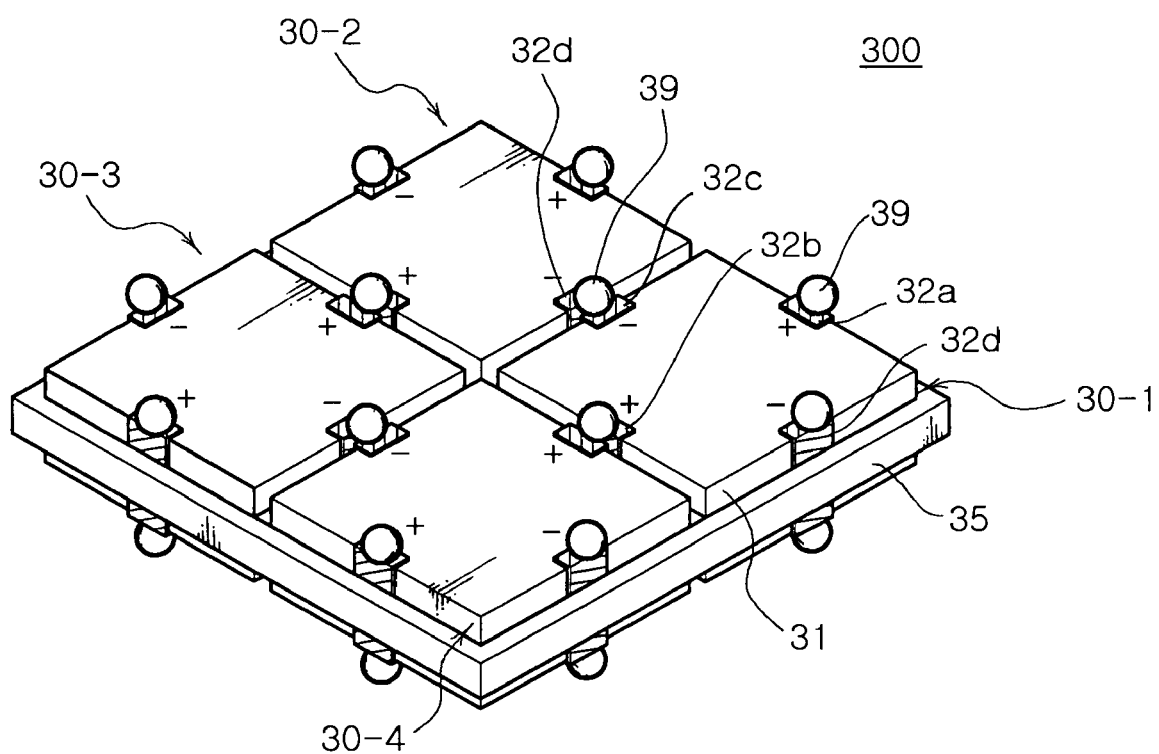
FIG. 6A is a perspective view illustrating an integrated chip capacitor module according to an exemplary embodiment of the invention.
Figure 6B:
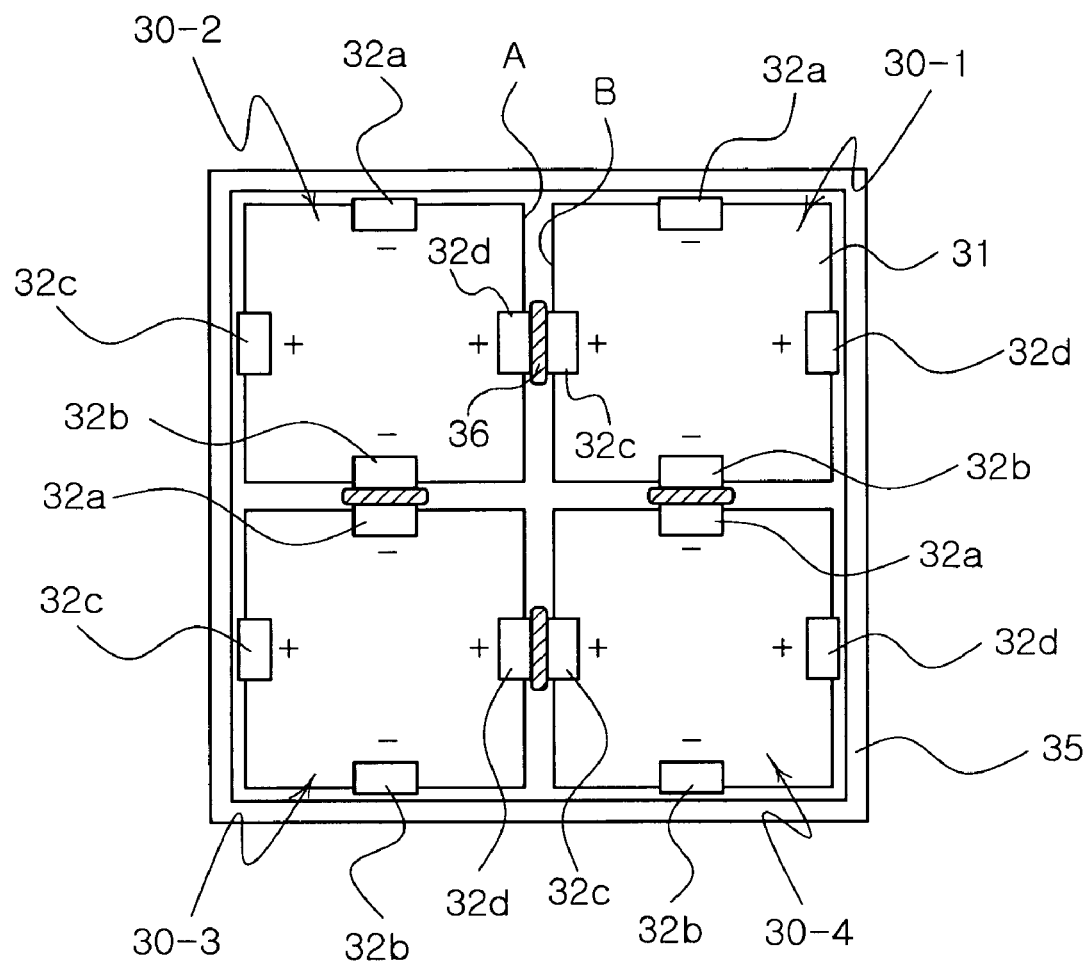
FIG. 6B is a plan view of the integrated chip capacitor module of FIG. 6A.
Figure 6C:
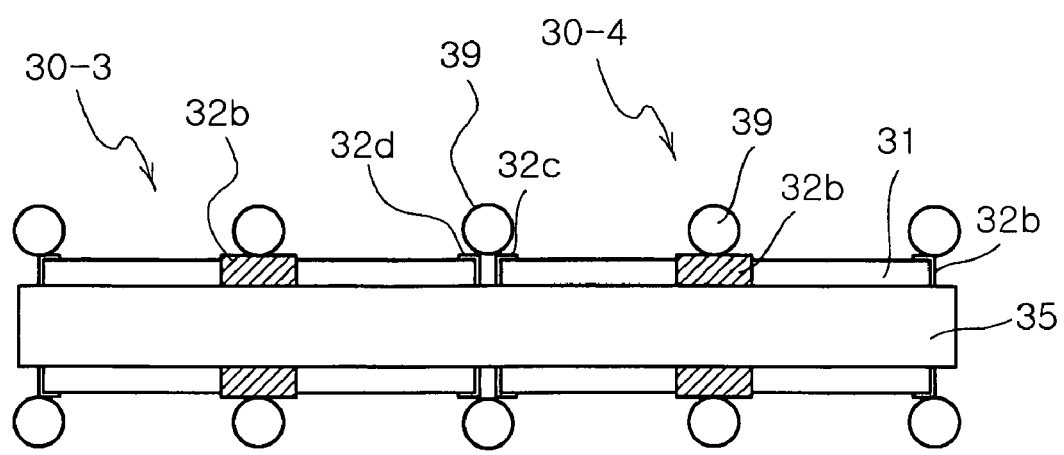
FIG. 6C is a side elevational view of the integrated chip capacitor module shown in FIG. 6A.

FIGS. 6A to 6C are a perspective view, a plan view and a side elevational view illustrating an integrated multilayer chip capacitor module, respectively according to an exemplary embodiment of the invention. In the present embodiment, a capacitor support 35 is not provided with a base portion, and open at a top and bottom thereof. Each of the capacitors 30-1 to 30-4 accommodated by the capacitor support 35 has external electrodes 32a, 32b, 32c, and 32d formed on sides of the capacitor body 31 to be partially extended to a top and bottom of the body 31. In the same manner as the embodiments of FIG. 2A to FIG. 3 described above, the capacitors 30-1 to 30-4 are arranged, the external electrodes in adjacent ones of the capacitors 30-1 to 30-4 are connected to each other and the capacitors have an internal structure.

As shown in FIGS. 6A to 6C, the capacitor support 35 has side walls and is open at a top and bottom thereof so as to expose top and bottom surfaces of the capacitors 30-1 to 30-4, thereby exposing a portion of each of the external electrodes extended onto the top of the capacitor body 31 (hereinafter, "top extension portion") and a portion of the external electrode extended onto the bottom of the capacitor body 31 (hereinafter, "bottom extension portion"). In this fashion, the top and bottom of the capacitor body are all exposed, thereby allowing the top extension portion and the bottom extension portion to be connected to an external circuit such as a conductive pad of the MPU package and a connecting pad of a mother board. Therefore, the top and bottom of the capacitor module 300 can serve as a mounting surface.

To connect the integrated multilayer chip capacitor module 300 to the external circuit board, a solder ball 39 may be bonded to the top extension portion and the bottom extension portion of the external electrode. This solder ball 30 enables the capacitor module 300 to be connected to the external circuit by a BGA connection method.

Figure 7:
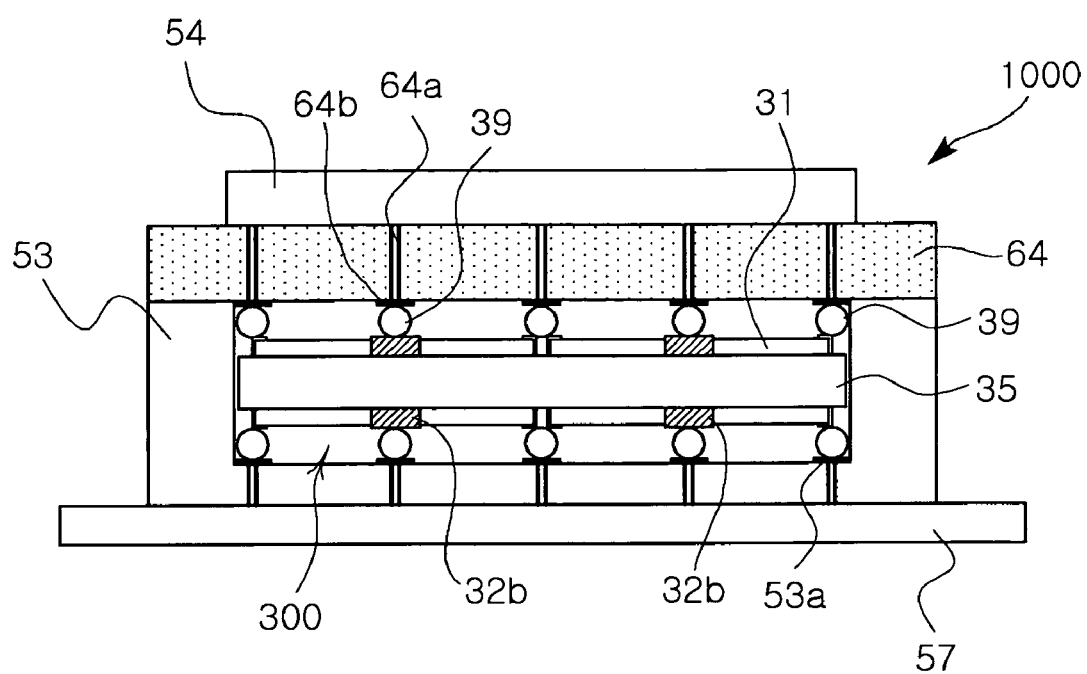
FIG. 7 is a cross-sectional view illustrating an integrated circuit apparatus having the integrated chip capacitor module of FIG. 6A.

FIG. 7 illustrates an integrated circuit apparatus according to an exemplary embodiment of the invention, particularly a schematic cross-sectional view illustrating an MPU integrated circuit apparatus having the capacitor module 300. Referring to FIG. 7, the MPU integrated circuit apparatus 1000 includes a wiring board 64 and a capacitor module 300 disposed thereunder. The wiring board 64 is used as an MPU package and has an MPU chip 54 mounted thereon. Notably, in the present embodiment, the integrated multilayer chip capacitor module 300 is disposed in a cavity of a socket 53 provided under the wiring board 64 or in an inner space thereof. However, such a socket 53 is not necessary and may be substituted by an adequate wiring structure.

Necessary wiring conductors such as vias 64a and conductive pads 64b are formed in the wiring board 64, respectively. The conductive pads 64b formed on a bottom of the wiring board 64 may be electrically connected to external electrodes of the capacitor module 300 by solder balls 39. This wiring structure allows the external electrodes of the capacitor to be electrically connected to terminals of the MPU chip 54. Moreover, wire conductors 53a of the socket 53 may be connected to the capacitor module 300 by the solder balls 39. The MPU integrated circuit apparatus 1000 may be surface-mounted on the mother board 57. The integrated multilayer chip capacitor 300 may be connected to a ground terminal and a power terminal of the wiring board 64 to be utilized as a decoupling capacitor for stabilizing the MPU power circuit.

Figure 8:
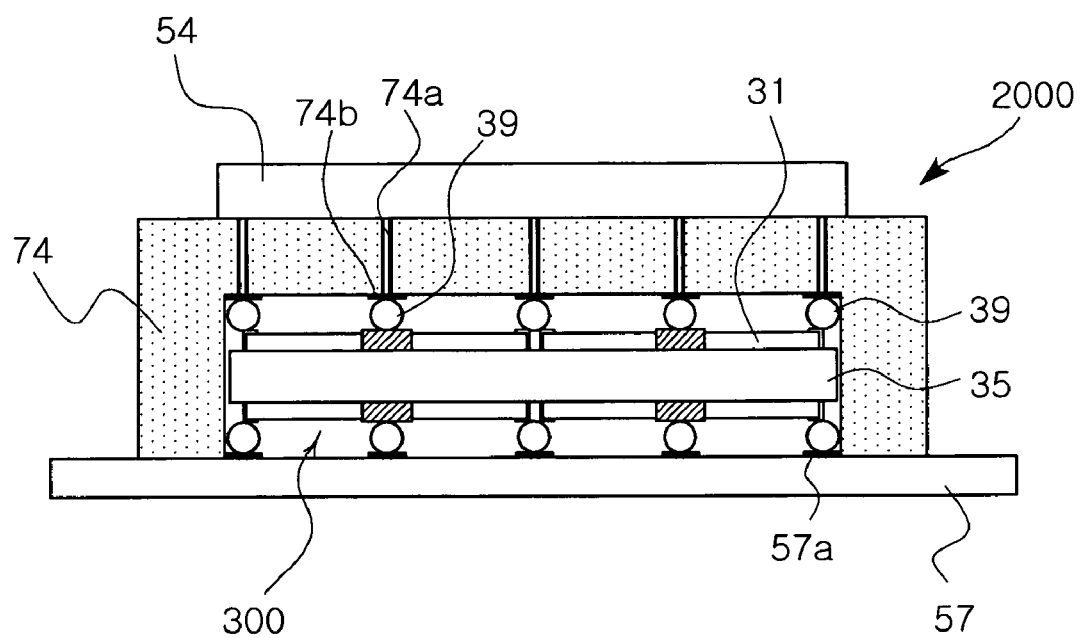
FIG. 8 is a cross-sectional view illustrating an integrated circuit apparatus having the integrated chip capacitor module of FIG. 6A.

FIG. 8 is a schematic cross-sectional view illustrating an MPU integrated circuit apparatus having the capacitor module 300 of FIG. 6A according to an exemplary embodiment of the invention. In the MPU integrated circuit apparatus 2000 of FIG. 8, the integrated multilayer chip capacitor module 300 is disposed in a cavity formed underneath a wiring board 74. In a case where the wiring board 74 of FIG. 8 is upside down, the capacitor module 300 is mounted on a bottom of the cavity. The external electrodes of capacitors are connected to the MPU chip 54 or terminals of the MPU package (power terminal and ground terminal) via wire conductors 74a and 74b and solder balls 39. The integrated circuit apparatus 2000 can be surface-mounted on the mother board 57. Here, the solder balls 39 disposed on a bottom of the capacitor module 300 may be connected to pads 57a of the mother board 57.

As shown in the embodiments of FIGS. 7 and 8, the solders are attached on the tops and bottoms of the capacitors and then packaged by the capacitor support 35. This allows the capacitors to be mounted at a higher density and the MPU integrated circuit apparatus to be further reduced in size. Moreover, this provides a current path extending from the overlying wiring board 64 and 74 through the external electrodes of the capacitor module 300 to the underlying mother board 57. Here, the current path may be advantageously utilized as an additional power line or a ground line. With a greater number of the power lines or the ground lines in a limited circuit mounting area, more resistances are connected in parallel with one another, thereby reducing total resistance and accordingly resulting in less resistance-induced heat.

In the MPU integrated circuit apparatus of FIGS. 7 and 8, the decoupling capacitor module adopts the capacitor module of FIG. 6A, but the present invention is not limited thereto. In a case where the capacitor module is open only at a top (see FIGS. 2a, 4, and 5), the wiring board for the MPU package having a suitable wiring structure may be employed to be utilized as the decoupling capacitor module of the MPU integrated circuit.

Figure 9:
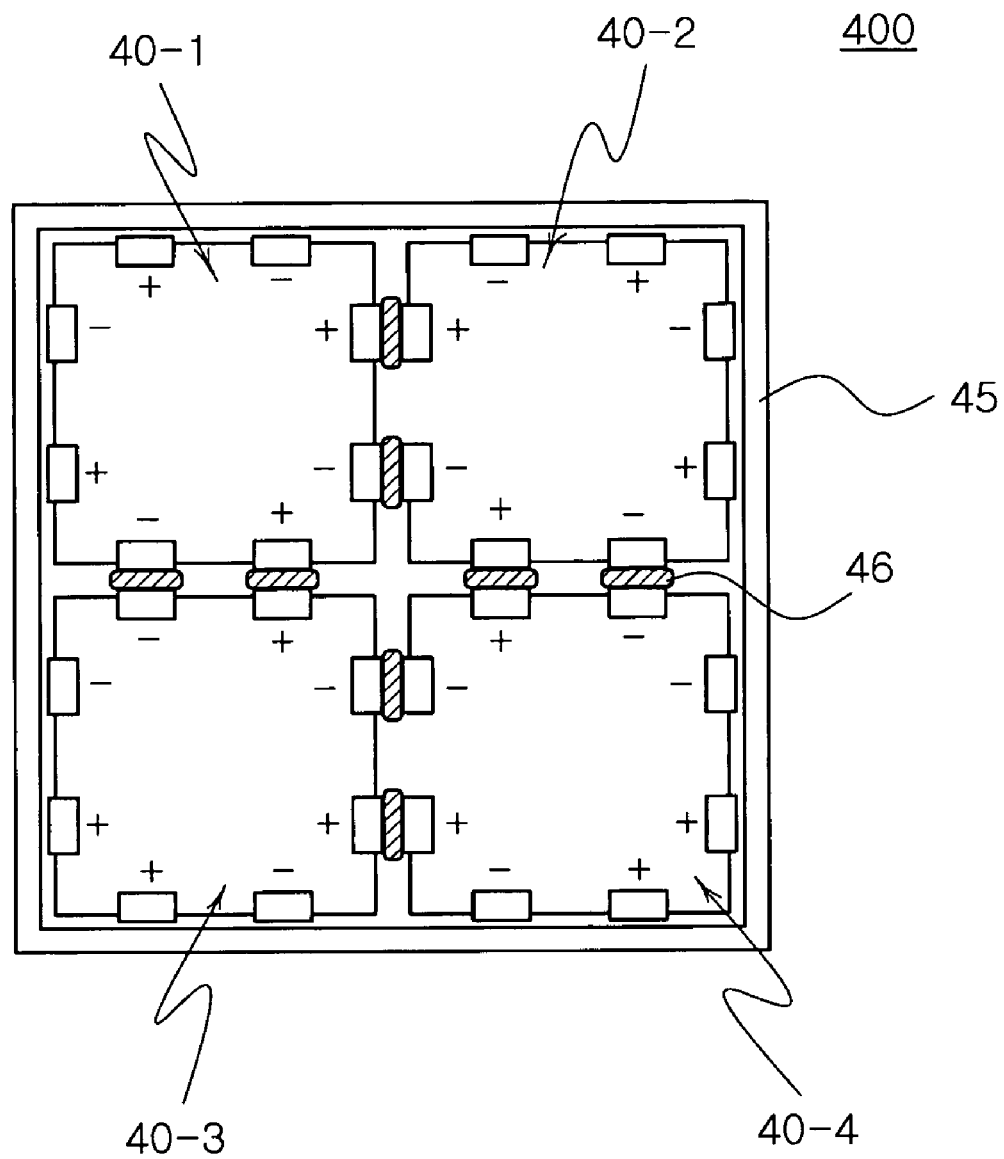
FIG. 9 is a plan view illustrating an integrated multilayer chip capacitor module according to an exemplary embodiment of the invention.
Figure 10:
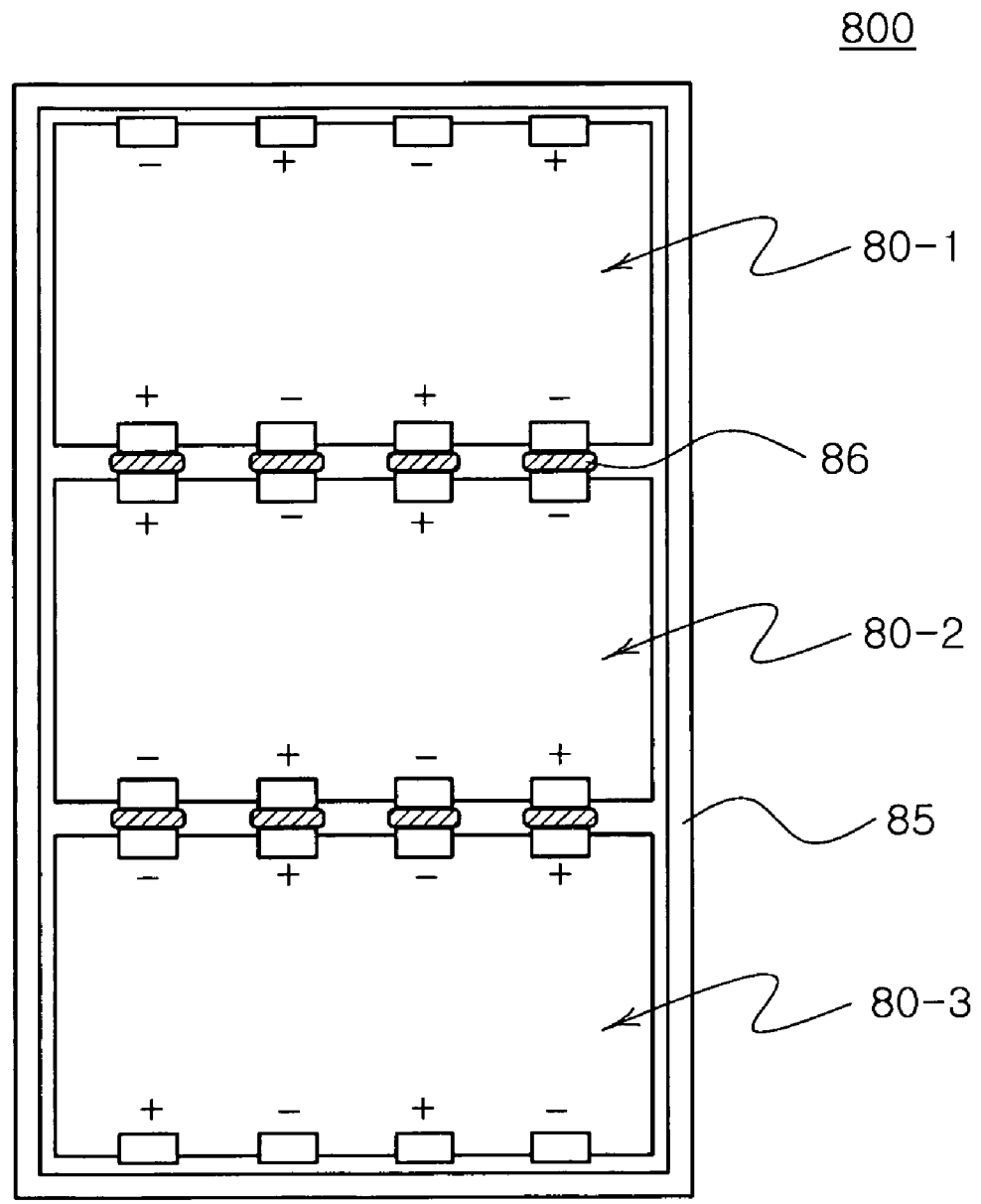
FIG. 10 is a plan view illustrating an integrated multilayer chip capacitor module according to an exemplary embodiment of the invention.

FIGS. 9 and 10 are plan views illustrating a multilayer chip capacitor module according to an exemplary embodiment of the invention, respectively.

Referring to FIG. 9, the integrated multilayer chip capacitor module 400 includes four multilayer chip capacitors 40-1, 40-2, 40-3, and 40-4 arranged close to one another in a 2×2 matrix, and a capacitor support accommodating the capacitors. External electrodes on adjacent sides of adjacent ones of the capacitors 40-2 and 40-4 are bonded to each other by a conductive adhesive material 46 to be electrically connected together, and the four capacitors are connected in parallel with one another. The capacitor support 45 has side walls, and may be open only at a top thereof, i.e., provided with a base portion or open at the top and bottom thereof, i.e., not provided with the base portion.

Each of the capacitors 40-1 and 40-4 has eight external electrodes formed on sides thereof such that two of the external electrodes are formed on each of the sides. The external electrodes of different polarity, i.e., four external electrodes of plus polarity and four external electrodes of minus polarity are arranged alternately along an edge of the body. This eight-terminal capacitor may be employed to constitute the integrated multilayer chip capacitor module.

Referring to FIG. 10, the integrated multilayer chip capacitor module 800 includes three capacitors 80-1, 80-2, and 80-3 arranged close to one another in a 1×3 or 3×1 matrix and a capacitor support 85 accommodating the capacitors 80-1 to 80-3. The three capacitors are connected in parallel with one another via a conductive adhesive material 86. Unlike the embodiments described above, each of the capacitors 80-1 to 80-3 has eight external electrodes formed such that four of the external electrodes are arranged on corresponding opposing sides. The external electrodes of different polarity are arranged alternately on each of the opposing sides.

In the aforementioned embodiments of FIGS. 9 to 10, the multi-terminal capacitors can be mounted at a higher density, and capacitance density, i.e., total capacitance/total mounting area, is increased, as described above. As a result, total inductance is lowered and total capacitance is increased while overall mounting density is limited, thereby decreasing total impedance.

Example

In order to identify characteristics of their proposed capacitor module, the inventors conducted experiments for measuring capacitance density and total inductance of the capacitor module.

Inventive Example 1

In a capacitor module of Inventive Example 1, four multilayer chip capacitors with a size of 1005 (1.0 mm×0.5 mm) were arranged close to one another and co-planar with one another in a 2×2 matrix. The chip capacitors were mounted on a capacitor body (see reference numeral 25 of FIG. 2A). Each of the capacitors is a multi-terminal and low-ESL capacitor having a capacitance of 2.2 μF. This capacitor module was mounted on a PCB.

To compare with characteristics of Inventive Example 1, Comparative Example 1 was prepared, in which four multi-layer capacitors with a same size of 1005 were mounted discretely on a PCB in a conventional mounting method. The discrete capacitors mounted according to Comparative Example 1 were connected in parallel with one another through a wiring pattern previously formed on the PCB.

Table 1 below shows total occupied area (total mounting area) and capacitance density measured in Inventive Example 1 and Comparative Example 1, respectively.

TABLE 1

|  | Occupied area | Capacitance density |
|---|---|---|
| Comparative Example 1 (Discrete capacitors) | 5 mm$^2$ | 1.75 mF/mm$^2$ |
| Inventive Example 1 (Integrated capacitor module) | 3.75 mm$^2$ | 2.35 mF/mm$^2$ |

As noted in Table 1, when compared with an arrangement structure of Comparative Example 1 where the plurality of capacitors were mounted discretely on the PCB board, the capacitor module of Inventive Example 1 had an occupied area decreased from 5 mm$^2$ to 3.75 mm$^2$ and a capacitance density increased from 1.75 mF/mm$^2$ to 2.35 mF/mm$^2$.

Inventive Example 2

Apart from Inventive Example 1, capacitors with a 1005 size and 100pH ESL were employed to obtain a maximum number of mountable capacitors in a limited total mounting area (10 mm×10 mm) and measure total inductance when the maximum number of capacitors were mounted.

In Inventive Example 2, the capacitor module shown in FIG. 2A was adopted to mount the capacitors on the PCB. In Comparative Example 2, the capacitors were mounted discretely on the PCB by a conventional mounting method (see Comparative Example 1, a different number of capacitors from Comparative Example 1).

TABLE 2

|  | Maximum number of mountable capacitors | Total inductance |
|---|---|---|
| Comparative Example 2 (Discrete capacitors) | 80 | 1.25 pH |
| Inventive Example 2 (Integrated capacitor module) | 104 | 0.96 pH |

As noted in Table 2, when compared with Comparative Example 2 where the capacitors are arranged discretely, in the capacitor module of Inventive Example 2, a greater number of capacitors can be mounted in an identical space, i.e., limited mounting area, thereby further reducing total inductance.

In the capacitor module, as shown in Inventive Examples 1 and 2, multi-terminal capacitors can be mounted at a greater density in a limited total mounting area. Also, a predetermined number of multi-terminal capacitors occupy a smaller mounting area. The low-ESL multi-terminal capacitors mounted at a higher density in a smaller total occupied area serve to reduce total impedance of the decoupling capacitors.

As set forth above, according to exemplary embodiments of the invention, multi-terminal multi-layer chip capacitors are mounted at a higher density, while reduced in total inductance. This effectively decreases power network impedance in a high-frequency and low-frequency region, thereby leading to a more stable power circuit.

While the present invention has been shown and described in connection with the exemplary embodiments, it will be apparent to those skilled in the art that modifications and variations can be made without departing from the spirit and scope of the invention as defined by the appended claims.

What is claimed is:

1. An integrated multilayer chip capacitor module comprising:
    a plurality of multilayer chip capacitors arranged close to one another and co-planar with one another; and
    a capacitor support accommodating the multilayer chip capacitors,
    wherein each of the multilayer chip capacitors comprises a rectangular parallelepiped capacitor body and a plurality of first and second external electrodes formed on at least two sides of the capacitor body, and
    the external electrodes on adjacent sides of adjacent ones of the multilayer chip capacitor in the capacitor support are electrically connected to each other by a conductive adhesive material.

2. The integrated multilayer chip capacitor module of claim 1, wherein the capacitor body comprises a plurality of first and second internal electrodes arranged alternately while interposing a dielectric layer therebetween, each of the internal electrodes having at least one lead extended to a side of the capacitor body, and the first and second external electrodes are connected to the first and second internal electrodes through the lead, respectively.

3. The integrated multilayer chip capacitor module of claim 1, wherein the first and second external electrodes are partially extended to a top of the capacitor body.

4. The integrated multilayer chip capacitor module of claim 3, wherein the capacitor support is open at a top thereof so as to expose top surfaces of the multilayer chip capacitors.

5. The integrated multilayer chip capacitor module of claim 1, wherein the first and second external electrodes are partially extended to a top and bottom of the capacitor body.

6. The integrated multilayer chip capacitor module of claim 5, wherein the capacitor support is open at a top and bottom thereof so as to expose top and bottom surfaces of the multilayer chip capacitors.

7. The integrated multilayer chip capacitor module of claim 6, wherein extension portions of the external electrodes extended to the top and bottom of the capacitor body have respective solder balls disposed thereon to be connected to a corresponding one of the external electrodes.

8. The integrated multilayer chip capacitor module of claim 1, wherein the first and second external electrodes in the multilayer chip capacitor are arranged alternately along an edge of the capacitor body.

9. The integrated multilayer chip capacitor module of claim 1, wherein the multilayer chip capacitor has four external electrodes formed on four sides of the capacitor body, respectively,
    wherein the external electrodes are arranged to have different polarities alternately, along an edge of the capacitor body.

10. The integrated multilayer chip capacitor module of claim 1, wherein the multilayer chip capacitor has eight external electrodes formed on four sides of the capacitor body, each of the sides having two of the external electrodes, wherein the external electrodes are arranged to have different polarities alternately, along an edge of the capacitor body.

11. The integrated multilayer chip capacitor module of claim 1, wherein the multilayer chip capacitor has at least two external electrodes on two opposing sides of the capacitor body, respectively,
wherein the external electrodes are arranged to have different polarities alternately on each of the sides.

12. The integrated multilayer chip capacitor module of claim 1, wherein the multilayer chip capacitors are arranged in a matrix of n×m in the capacitor support, wherein n and m are integers of at least 1 and n+m≧3.

13. The integrated multilayer chip capacitor module of claim 1, wherein the conductive adhesive material is selected from one of silver, nickel, gold, copper and a mixture of at least two thereof.

14. The integrated multilayer chip capacitor module of claim 1, wherein the conductive adhesive material comprises a heat-resistant adhesive capable of resisting a temperature of 250° C.

15. An integrated circuit apparatus comprising:
an integrated multi-layer chip capacitor module; and
a circuit board having the integrated multi-layer chip capacitor module mounted thereon,
wherein the integrated multilayer chip capacitor module comprises a plurality of multilayer chip capacitors arranged close to one another and co-planar with one another; and
a capacitor support accommodating the multilayer chip capacitors,
wherein each of the multilayer chip capacitors comprises a rectangular parallelepiped capacitor body and a plurality of first and second external electrodes formed on at least two sides of the capacitor body, and
the external electrodes on adjacent sides of adjacent ones of the multilayer chip capacitor in the capacitor support are electrically connected to each other by a conductive adhesive material.

16. The integrated circuit apparatus of claim 15, wherein a multi-processor unit chip is surface-mounted on the circuit board and the multilayer chip capacitor module is mounted in a cavity formed in the circuit board.

17. The integrated circuit apparatus of claim 15, further comprising a socket disposed on one surface of the circuit board to accommodate the integrated multilayer chip capacitor,
wherein the circuit board has the multi-processor unit chip surface-mounted on another surface thereof.

* * * * *